(12) United States Patent
Bobek et al.

(10) Patent No.: US 11,699,577 B2
(45) Date of Patent: Jul. 11, 2023

(54) TREATMENT FOR HIGH-TEMPERATURE CLEANS

(71) Applicant: Applied Materials, Inc., Santa Clara, CA (US)

(72) Inventors: Sarah Michelle Bobek, Sunnyvale, CA (US); Ruiyun Huang, Santa Clara, CA (US); Abdul Aziz Khaja, San Jose, CA (US); Amit Bansal, Milpitas, CA (US); Dong Hyung Lee, Danville, CA (US); Ganesh Balasubramanian, Fremont, CA (US); Tuan Anh Nguyen, San Jose, CA (US); Sungwon Ha, Palo Alto, CA (US); Anjana M. Patel, San Jose, CA (US); Ratsamee Limdulpaiboon, San Jose, CA (US); Karthik Janakiraman, San Jose, CA (US); Kwangduk Douglas Lee, Redwood City, CA (US)

(73) Assignee: Applied Materials, Inc., Santa Clara, CA (US)

(*) Notice: Subject to any disclaimer, the term of this patent is extended or adjusted under 35 U.S.C. 154(b) by 27 days.

(21) Appl. No.: 17/330,061

(22) Filed: May 25, 2021

(65) Prior Publication Data
US 2022/0384161 A1 Dec. 1, 2022

(51) Int. Cl.
*H01J 37/32* (2006.01)
*B08B 7/00* (2006.01)
*C23C 14/56* (2006.01)

(52) U.S. Cl.
CPC ...... *H01J 37/32862* (2013.01); *B08B 7/0035* (2013.01); *C23C 14/564* (2013.01);
(Continued)

(58) Field of Classification Search
CPC .......... H01J 37/32862; H01J 37/32449; H01J 37/32504; H01J 2237/335; B08B 7/0035; C23C 14/564
See application file for complete search history.

(56) References Cited

U.S. PATENT DOCUMENTS 6,379,575 B1 * 4/2002 Yin ..................... C04B 41/009
134/1.1
2006/0015100 A1 1/2006 Panjabi et al.
(Continued)

FOREIGN PATENT DOCUMENTS

JP 2015-012198 A 1/2015
KR 10-2008-0089902 A 10/2008
(Continued)

OTHER PUBLICATIONS

International Search Report and Written Opinion dated Aug. 31, 2022 in International Patent Application No. PCT/US2022/030649, 10 pages.

*Primary Examiner* — Erin F Bergner
(74) *Attorney, Agent, or Firm* — Kilpatrick Townsend & Stockton LLP

(57) ABSTRACT

Exemplary methods of treating a chamber may include delivering a cleaning precursor to a remote plasma unit. The methods may include forming a plasma of the cleaning precursor. The methods may include delivering plasma effluents of the cleaning precursor to a processing region of a semiconductor processing chamber. The processing region may be defined by one or more chamber components. The one or more chamber components may include an oxide coating. The methods may include halting delivery of the plasma effluents. The methods may include treating the oxide coating with a hydrogen-containing material delivered to the processing region subsequent halting delivery of the plasma effluents.

20 Claims, 2 Drawing Sheets

(52) U.S. Cl.
CPC .. *H01J 37/32449* (2013.01); *H01J 37/32504* (2013.01); *H01J 2237/335* (2013.01)

(56) References Cited

U.S. PATENT DOCUMENTS

| | | | |
|---|---|---|---|
| 2006/0151002 A1* | 7/2006 | Kumar | B08B 7/0035 |
| | | | 134/1.1 |
| 2015/0371864 A1 | 12/2015 | Hsu et al. | |
| 2016/0379833 A1 | 12/2016 | Hong et al. | |
| 2017/0323768 A1* | 11/2017 | Zhang | H01J 37/32862 |
| 2020/0144397 A1 | 5/2020 | Dube et al. | |

FOREIGN PATENT DOCUMENTS

| | | | |
|---|---|---|---|
| TW | 202035768 A | 10/2020 | |
| WO | 2014016835 A1 | 1/2014 | |

\* cited by examiner

TREATMENT FOR HIGH-TEMPERATURE CLEANS

TECHNICAL FIELD

The present technology relates to semiconductor cleaning processes. More specifically, the present technology relates to methods of treating chamber surfaces and coatings during cleaning operations.

BACKGROUND

Integrated circuits are made possible by processes which produce intricately patterned material layers on substrate surfaces. Producing patterned material on a substrate requires controlled methods of formation and removal of exposed material. After deposition processes have been performed within a chamber, chamber components may include residual materials from the deposition process. Chamber cleaning operations may remove residues from the chamber, however the process may erode chamber components over time.

Thus, there is a need for improved systems and methods that can be used to produce high quality devices and structures. These and other needs are addressed by the present technology.

SUMMARY

Exemplary methods of treating a chamber may include delivering a cleaning precursor to a remote plasma unit. The methods may include forming a plasma of the cleaning precursor. The methods may include delivering plasma effluents of the cleaning precursor to a processing region of a semiconductor processing chamber. The processing region may be defined by one or more chamber components. The one or more chamber components may include an oxide coating. The methods may include halting delivery of the plasma effluents. The methods may include treating the oxide coating with a hydrogen-containing material delivered to the processing region subsequent halting delivery of the plasma effluents.

In some embodiments, the cleaning precursor may include an oxygen-containing precursor. The one or more chamber components may include a carbon-containing residue. The methods may include removing the carbon-containing residue with the plasma effluents of the cleaning precursor. A temperature of the semiconductor processing chamber may be maintained at greater than or about 400° C. during the method of treating a chamber. Treating the oxide coating with a hydrogen-containing material may include flowing a hydrogen-containing gas into the processing region. The methods may include contacting the oxide coating with the hydrogen-containing gas. Treating the oxide coating with a hydrogen-containing material may include forming plasma effluents of a hydrogen-containing precursor. The methods may include flowing the plasma effluents of the hydrogen-containing precursor into the processing region. The methods may include contacting the oxide coating with the plasma effluents of the hydrogen-containing precursor. The methods may include forming the oxide coating on the one or more chamber components. Forming the oxide coating may include flowing a silicon-containing precursor and an oxygen-containing precursor into the processing region at a flow rate ratio of the silicon-containing precursor to the oxygen-containing precursor of between about 0.008 and about 0.03. Forming the oxide coating may include forming a plasma of the silicon-containing precursor and the oxygen-containing precursor at a plasma power of less than or about 500 W. The methods may include depositing a silicon oxide material on the one or more chamber components.

Some embodiments of the present technology may encompass methods of treating a chamber. The methods may include delivering an oxygen-containing precursor to a remote plasma unit. The methods may include forming a plasma of the oxygen-containing precursor. The methods may include delivering plasma effluents of the oxygen-containing precursor to a processing region of a semiconductor processing chamber. The processing region may be defined by one or more chamber components. the one or more chamber components may include an oxide coating and a carbon material. The methods may include halting delivery of the plasma effluents. The methods may include treating the oxide coating with a hydrogen-containing material delivered to the processing region subsequent halting delivery of the plasma effluents.

In some embodiments, the oxide coating may be or include silicon oxide. The methods may include removing the carbon material with the plasma effluents of the oxygen-containing precursor. The carbon material may include carbon residue from deposition of a carbon-containing material. Treating the oxide coating with a hydrogen-containing material may include flowing a hydrogen-containing gas into the processing region. The methods may include contacting the oxide coating with the hydrogen-containing gas. A temperature of the semiconductor processing chamber may be maintained at greater than or about 400° C. during the method of treating a chamber. Treating the oxide coating with a hydrogen-containing material may include forming plasma effluents of a hydrogen-containing precursor. The methods may include flowing the plasma effluents of the hydrogen-containing precursor into the processing region. The methods may include contacting the oxide coating with the plasma effluents of the hydrogen-containing precursor. The methods may include forming the oxide coating on the one or more chamber components.

Some embodiments of the present technology may encompass methods of treating a chamber. The methods may include delivering an oxygen-containing precursor to a remote plasma unit. The methods may include forming a plasma of the oxygen-containing precursor. The methods may include delivering plasma effluents of the oxygen-containing precursor to a processing region of a semiconductor processing chamber. The processing region may be defined by one or more chamber components. The one or more chamber components may include a silicon oxide coating overlying the one or more chamber components and a carbon material on regions of the silicon oxide coating. The methods may include removing the carbon material with the plasma effluents of the oxygen-containing precursor. The methods may include halting delivery of the plasma effluents. The methods may include treating the silicon oxide coating with a hydrogen-containing material delivered to the processing region subsequent halting delivery of the plasma effluents.

In some embodiments, treating the silicon oxide coating with a hydrogen-containing material may include flowing a hydrogen-containing gas into the processing region. The methods may include contacting the silicon oxide coating with the hydrogen-containing gas. Treating the silicon oxide coating with a hydrogen-containing material may include forming plasma effluents of a hydrogen-containing precursor. The methods may include flowing the plasma effluents of the hydrogen-containing precursor into the processing region. The methods may include contacting the silicon oxide coating with the plasma effluents of the hydrogen-containing precursor.

Such technology may provide numerous benefits over conventional systems and techniques. For example, the processes may produce a chamber coating able to be maintained for hundreds of wafer cycles or more. Additionally, the operations of embodiments of the present technology may overcome reductions in removal rates over time, while protecting chamber components from erosion. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
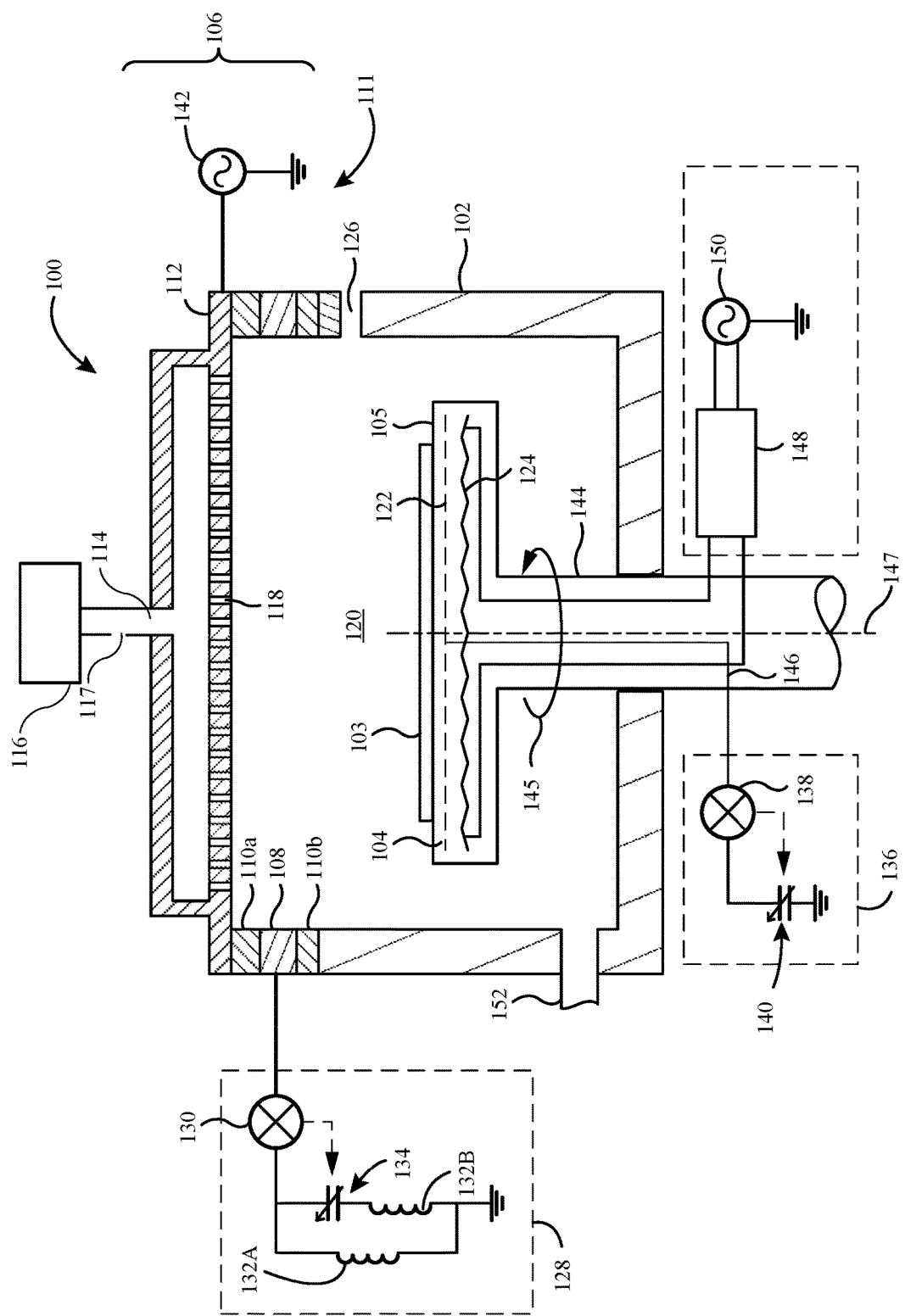
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Deposition operations in semiconductor processing may be included to form any number of materials on a substrate. For example, materials may be deposited on a substrate to produce semiconductor structures, as well as to facilitate patterning or removal of materials on a substrate. As one non-limiting example, hardmasks may be deposited on substrates to facilitate removal or patterning of materials on a substrate. The hardmask deposition may be performed in any number of ways, including by thermally-activated deposition as well as plasma-enhanced deposition. Regardless of the mechanism, many deposition operations deposit materials not only on the substrate being processed, but on chamber components as well. For example, in a processing region, deposition may occur on a substrate as well as a pedestal or support on which the substrate is seated, faceplates or diffusers that may distribute materials into the processing region, chamber walls defining the processing region, and components defining exhaust pathways for materials and byproducts subsequent deposition.

Once the deposition process is completed, the substrate may be removed from the processing region, and a cleaning process may be employed. Chamber cleaning may form a plasma of one or more precursors that may etch or otherwise remove residual materials formed on the chamber components in order to essentially reset the chamber prior to a subsequent processing operation, which may help maintain consistency wafer-to-wafer. However, these chamber cleaning operations may produce a number of challenges. For example, an in situ plasma, such as generated inductively or via capacitive coupling, may be readily controlled to ensure more thorough cleaning may be performed, and cleaning materials may reach the various architectural geometries of the processing region. However, in situ cleaning may increase bombardment of chamber surfaces, which can erode the chamber components over time.

Remotely-generated plasma cleans may reduce bombardment, although new challenges may occur. For example, radical-based cleaning may be sensitive to a number of factors that can cause the etchant materials to recombine and reduce etching, or be incapable of reaching deposited material about the chamber. To compensate for these issues, many processes utilizing remote plasma cleaning utilize halogen materials to perform the cleaning operations. For example, chlorine or fluorine precursors may be used to generate radical species that may then more readily or aggressively remove materials in the processing chamber. However, most halogen cleaning is performed at lower chamber temperatures to protect chamber equipment, and as processing temperatures increase, halogen cleaning materials may more aggressively etch materials in the chamber, and may form byproducts that can affect chamber performance. As one example, fluorine etchants may interact with aluminum cleaning components to produce aluminum fluoride, which may form flakes that can deposit on substrates producing defects. Some conventional technologies may attempt to overcome this issue by forming chamber coatings prior to the deposition operations, which may allow the cleaning effluents to interact with the coatings, and protect the surface from excess damage. This may be sufficient at lower operating temperatures, but at higher operating temperatures the halogen materials may be sufficiently activated to remove chamber coatings, such as silicon oxide, as well as residues deposited on the coatings. This may require seasoning prior to each deposition sequence, and may still cause chamber component damage over time due to the coating removal.

The present technology may overcome these limitations by producing a seasoning or coating that may be maintained during subsequent removal operations performed to remove deposition byproducts. The present technology also may encompass a treatment to rehabilitate a coating or seasoning that can otherwise cause reduced removal during chamber cleaning operations over time. After describing general aspects of a chamber according to embodiments of the present technology in which plasma processing operations discussed below may be performed, specific methodology and component configurations may be discussed. It is to be understood that the present technology is not intended to be limited to the specific chambers or processing discussed, as the techniques described may be used to improve a number of processes, and may be applicable to a variety of processing chambers and operations. For example, while an exemplary top-feed RF chamber will be described below, bottom-feed RF path configurations are similarly encompassed by the present technology.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Inlet 114 may include delivery from a remote plasma source unit 116, which may be fluidly coupled with the chamber, as well as a bypass 117 for process gas delivery that may not flow through the remote plasma source unit 116 in some embodiments. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

As explained previously, chamber cleaning operations according to some embodiments of the present technology may include forming a remote plasma and delivering plasma effluents to the processing region of the chamber. To protect chamber surfaces, a coating, such as an oxide coating, may be formed over surfaces of the chamber. To limit removal of the coating between processes, halogen-containing cleaning materials may not be used in some embodiments of the present technology. However, testing has shown that removal rates of residual materials may decrease over time in some processing, such as when an oxygen-containing plasma is used to remove carbon residue from an oxide coating. Although the coating may not be removed during the etch process, and may be retained for subsequent deposition sequences, removal of residue may be limited, and processing drift may occur over time as buildup occurs within the chamber. Without being bound to any particular theory, oxygen recombination may increase on oxide coatings at higher temperature, which may limit etchant species within the processing region. As temperature within the processing chamber increases, such as greater than or about 200° C., greater than or about 300° C., greater than or about 400° C., greater than or about 500° C., greater than or about 600° C., or higher, recombination rates of oxygen may increase dramatically. Testing has shown that increasing gas or effluent flow may still insufficiently etch residual materials due to recombination.

For example, oxide coatings, such as silicon oxide as one non-limiting example, may be characterized by surface bonds and ligands including hydroxyl moieties. As the coatings are contacted by oxygen radical species, hydrogen depletion may occur at the surface, which may create active sites, such as oxygen dangling bonds. These bond sites may more readily cause recombination. The interaction occurring may not be removing the coating, but may be a surface effect depleting hydrogen at the coating surface terminations. The reactions may also increase surface temperature of the coating, which may increase the recombination further. Consequently, the oxygen etchants may be quenched within the chamber, and removal rates of deposition byproducts may decrease with each successive substrate sequence. This may cause residue buildup within the chamber, which can impact processes and cause drift between wafers, and may cause defects due to insufficient cleaning. However, the present technology has determined that a hydrogen treatment subsequent the clean process rehabilitates degraded surface bonding, which may replenish hydrogen at the surface of the coating, and which may produce more consistent removal in each cycle. Accordingly, the present technology may afford chamber treatments that may limit process drift due to cleaning effects.

Figure 2:
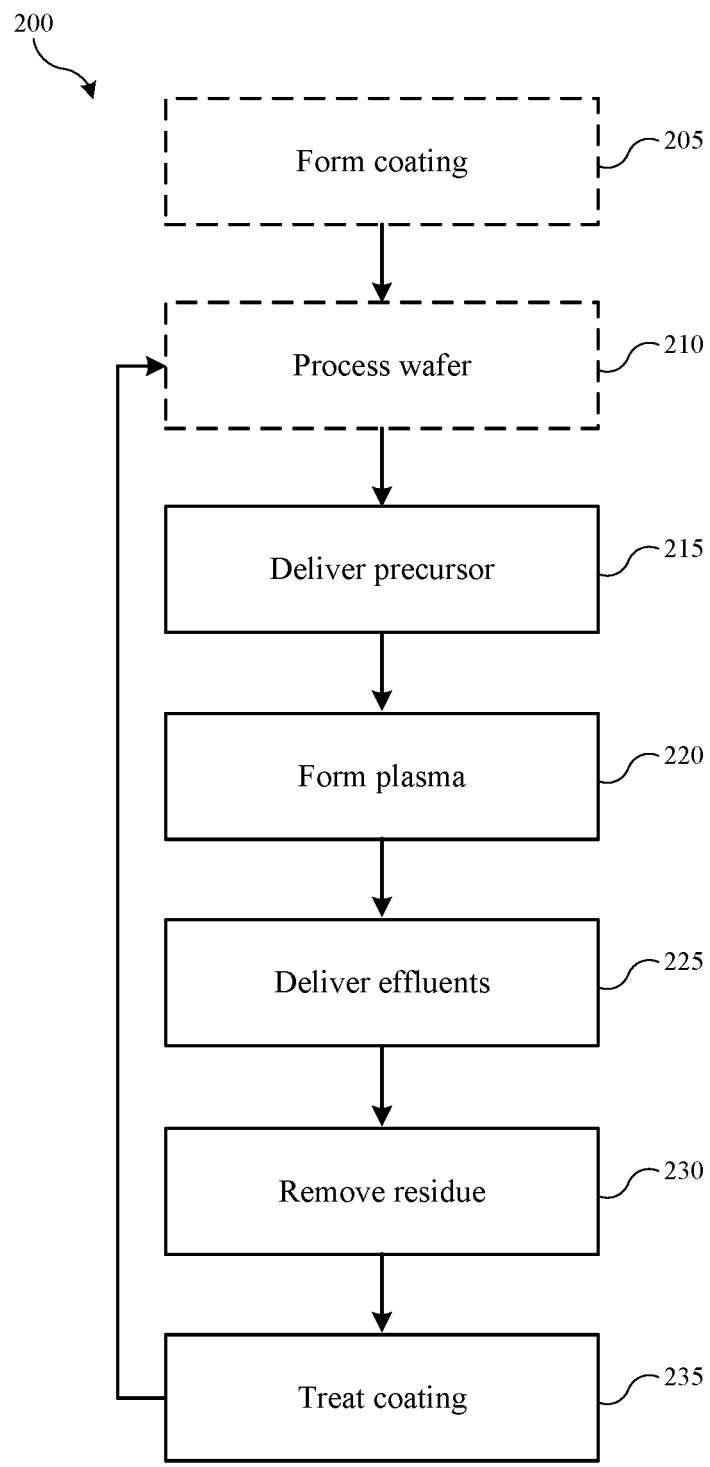
FIG. 2 shows exemplary operations in a deposition method according to some embodiments of the present technology.

FIG. 2 shows exemplary operations in a method 200 of treating a chamber according to some embodiments of the present technology. The method may be performed in a variety of processing chambers, including processing chamber 100 described above. Method 200 may include a number of optional operations, which may or may not specifically be associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, in some embodiments, the present technology may include forming a coating which may reduce negative interactions during processing. At optional operation 205, a coating, such as an oxide coating, may be applied to or formed over surfaces of one or more components of the processing chamber, such as any component noted previously. The coating may be an oxide of any number of materials, which may be changed based on processing to occur in the chamber. As one non-limiting example, the oxide coating may be a silicon oxide coating formed to reduce roughness of the coating, which may facilitate residue removal. The coating may be formed by a plasma-enhanced process within the processing region, and may include flowing a silicon-containing precursor and an oxygen-containing precursor into the processing region.

Process conditions may be controlled to limit roughness of the deposited film. For example, in some embodiments a flow rate ratio of the silicon-containing precursor to the oxygen-containing precursor may maintained relatively low, and in some embodiments may be maintained between about 0.008 and 0.03. This may reduce hydrogen incorporation within the film, and may also beneficially produce a smoother film deposition. Additionally, the deposition may be performed at a relatively low plasma power, which may also limit sputtering that can increase roughness. For example, the deposition may be performed at a plasma power of less than or about 500 W, less than or about 400 W, less than or about 300 W, less than or about 200 W, or less, while the silicon oxide material is deposited on surfaces of the processing chamber. By performing a coating deposition as described, the produced silicon oxide film may be characterized by an average roughness of less than or about 1.0 nm, and may be characterized by an average roughness of less than or about 0.9 nm, less than or about 0.8 nm, less than or about 0.7 nm, less than or about 0.6 nm, less than or about 0.5 nm, less than or about 0.4 nm, less than or about 0.3 nm, less than or about 0.2 nm, less than or about 0.1 nm, or less.

After the coating has been formed or deposited, processing within the chamber may be performed, such as a deposition process at optional operation 210. The process may include positioning a substrate within a processing region of the chamber, such as on a pedestal as previously described. The deposition may include forming any number of conductive or dielectric materials on the substrate, as well as depositing hardmasks or other materials. As one non-limiting example, in some embodiments the process may include depositing a carbon-containing material on the substrate, such as a carbon-containing hardmask. The process may include forming a plasma of a carbon-containing precursor, or thermally reacting a carbon-containing precursor to deposit carbon-containing material on the substrate. Any number of dopants or other materials that may be used in carbon hardmasks may be included with the carbon-containing precursor. As noted previously, the process may also cause material to be deposited on one or more components of the chamber, including on the oxide coating previously formed.

The process may include removing the substrate from the processing region, and performing a cleaning operation. As discussed above, forming an in situ plasma may damage components and coatings via bombardment, and thus in some embodiments, method 200 may include delivering a cleaning precursor to a remote plasma unit at operation 215. The precursor may include any number of gases used in chamber cleaning, including halogen-containing materials, however in some embodiments the present technology may not include halogen-containing materials in the cleaning process when the process is being performed at temperatures above or about 200° C., above or about 400° C., or higher, which may cause excessive damage to the chamber and coatings. Continuing the non-limiting example discussed above for carbon deposition, the residue may be or include a carbon-containing material, and the cleaning precursor may be or include an oxygen-containing precursor. Exemplary oxygen-containing precursors may be or include diatomic oxygen, ozone, nitrous oxide, nitric oxide, or any other oxygen-containing material.

At operation 220 a plasma may be formed in the remote plasma unit, which may produce plasma effluents of the cleaning precursor, such as oxygen-containing plasma effluents. The process may include flowing or delivering the plasma effluents to the processing region of the chamber at operation 225. The plasma effluents may interact with surfaces within the processing region, which may allow removal of residual material from the deposition, such as may include a carbon-containing material, at operation 230. The plasma effluents may also interact with the coating on the chamber materials. By utilizing oxygen-containing plasma effluents that may interact with an oxide coating, the coating may be maintained during the removal operation, even at elevated temperatures.

As explained above, if the processing were then repeated, subsequent removal rates may reduce over time, which may be caused by hydrogen depletion on the surface of the coating, and which may lead to increased recombination of plasma effluents. Processing according to some embodiments may occur at increased temperatures as discussed above, which may be greater than or about 400° C. in some embodiments, and which may increase recombination rates even further. However, the present technology may include a subsequent treatment to the chamber coating, which may ensure consistent removal during each cycle. For example, in some embodiments, the plasma of the oxygen-containing precursor may be halted, and the chamber may be purged.

At operation 235, a treatment may be performed on the oxide coating, which may rehabilitate hydrogen depletion that may have occurred during the cleaning process. For example, the treatment may include delivering a hydrogen-containing material to the processing region subsequent the chamber clean. The hydrogen-containing material may interact with the coating after process residues have been removed. The chamber may be maintained at the processing temperatures noted above, and the hydrogen-containing material may donate hydrogen to the surface of the coating, which may replenish lost hydrogen. The hydrogen may rehabilitate the coating to a base state, which may be consistent with the coating state prior to performing the cleaning operations.

Testing has shown that the treatment may be performed with any number of hydrogen-containing materials, such as diatomic hydrogen, ammonia, water vapor, an alcohol, or any other hydrogen containing or hydroxyl-containing materials, for example. The hydrogen-containing material may be delivered with one or more carrier materials, such as argon, helium, nitrogen, or other gases. Additionally, the treatment may be performed thermally, or with a plasma enhanced process. For example, because chamber temperatures may be maintained relatively high in some embodiments as noted above, the process may involve flowing a hydrogen-containing material through the processing chamber, and allowing the hydrogen-containing material to contact the oxide coating. Additionally, in some embodiments, a plasma may be formed of the hydrogen-containing material, and hydrogen-containing plasma effluents may interact with the coating.

In some embodiments in which the treatment may be or include a plasma treatment, a plasma power may be maintained relatively low to limit interaction beyond a surface of the coating, such as to provide a treatment that operates in a chemisorption regime instead of a chemical etching regime. For example, an in situ plasma may be formed at a power level of less than or about 1000 W, and may be formed at less than or about 900 W, less than or about 800 W, less than or about 700 W, less than or about 600 W, less than or about 500 W, less than or about 400 W, less than or about 300 W, less than or about 200 W, less than or about 100 W, or less. A pressure during the treatment may be maintained at less than or about 12 Torr, and may be maintained at less than or about 10 Torr, less than or about 8 Torr, less than or about 6 Torr, less than or about 4 Torr, less than or about 2 Torr, or less. By operating at relatively low pressure, increased radical flow may occur, which may ensure improved interaction across the oxide film within the processing region.

After the treatment has been performed, the process may be repeated by providing a subsequent wafer for processing. By performing treatments according to some embodiments of the present technology, chamber coatings may be maintained process-to-process, which may reduce cleaning plasma recombination that can lower etch rates. The maintained etch rates may increase consistency of residue removal during chamber cleaning, which may limit residue buildup that can lead to process drift wafer-to-wafer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of treating a chamber, the method comprising:
    delivering a cleaning precursor to a remote plasma unit;
    forming a plasma of the cleaning precursor;
    delivering plasma effluents of the cleaning precursor to a processing region of a semiconductor processing chamber, wherein the processing region is defined by one or more chamber components, wherein the one or more chamber components comprise an oxide coating;
    halting delivery of the plasma effluents; and
    treating the oxide coating with a hydrogen-containing material delivered to the processing region subsequent halting delivery of the plasma effluents, wherein the treating rehabilitates hydrogen depletion from delivery of plasma effluents of the cleaning precursor.

2. The method of treating a chamber of claim 1, wherein the cleaning precursor comprises an oxygen-containing precursor.

3. The method of treating a chamber of claim 1, wherein the one or more chamber components further comprise a carbon-containing residue.

4. The method of treating a chamber of claim 3, further comprising:
    removing the carbon-containing residue with the plasma effluents of the cleaning precursor.

5. The method of treating a chamber of claim 1, wherein a temperature of the semiconductor processing chamber is maintained at greater than or about 400° C. during the method of treating a chamber.

6. The method of treating a chamber of claim 1, wherein treating the oxide coating with the hydrogen-containing material comprises:
    flowing a hydrogen-containing gas into the processing region; and
    contacting the oxide coating with the hydrogen-containing gas.

7. The method of treating a chamber of claim 1, wherein treating the oxide coating with a hydrogen-containing material comprises:
    forming plasma effluents of a hydrogen-containing precursor;
    flowing the plasma effluents of the hydrogen-containing precursor into the processing region; and
    contacting the oxide coating with the plasma effluents of the hydrogen-containing precursor.

8. The method of treating a chamber of claim 1, further comprising:
    forming the oxide coating on the one or more chamber components.

9. The method of treating a chamber of claim 8, wherein forming the oxide coating comprises:
    flowing a silicon-containing precursor and an oxygen-containing precursor into the processing region at a flow rate ratio of the silicon-containing precursor to the oxygen-containing precursor of between about 0.008 and about 0.03.

10. The method of treating a chamber of claim 9, wherein forming the oxide coating comprises:
    forming a plasma of the silicon-containing precursor and the oxygen-containing precursor at a plasma power of less than or about 500 W; and
    depositing a silicon oxide material on the one or more chamber components.

11. A method of treating a chamber, the method comprising: delivering an oxygen-containing precursor to a remote plasma unit; forming a plasma of the oxygen-containing precursor; delivering plasma effluents of the oxygen-containing precursor to a processing region of a semiconductor processing chamber, wherein the processing region is defined by one or more chamber components, wherein the one or more chamber components comprise an oxide coating and a carbon material, and wherein the plasma effluents are halogen-free; halting delivery of the plasma effluents; and treating the oxide coating with a hydrogen-containing material delivered to the processing region subsequent halting delivery of the plasma effluents, wherein the treating rehabilitates hydrogen depletion from delivery of plasma effluents of the oxygen-containing precursor.

12. The method of treating a chamber of claim 11, wherein the oxide coating comprises silicon oxide.

13. The method of treating a chamber of claim 11, further comprising:
  removing the carbon material with the plasma effluents of the oxygen-containing precursor, wherein the carbon material comprises carbon residue from deposition of a carbon-containing material.

14. The method of treating a chamber of claim 11, wherein treating the oxide coating with a hydrogen-containing material comprises:
  flowing a hydrogen-containing gas into the processing region; and
  contacting the oxide coating with the hydrogen-containing gas.

15. The method of treating a chamber of claim 11, wherein a temperature of the semiconductor processing chamber is maintained at greater than or about 400° C. during the method of treating a chamber.

16. The method of treating a chamber of claim 11, wherein treating the oxide coating with a hydrogen-containing material comprises:
  forming plasma effluents of a hydrogen-containing precursor;
  flowing the plasma effluents of the hydrogen-containing precursor into the processing region; and
  contacting the oxide coating with the plasma effluents of the hydrogen-containing precursor.

17. The method of treating a chamber of claim 11, further comprising:
  forming the oxide coating on the one or more chamber components.

18. A method of treating a chamber comprising:
  delivering an oxygen-containing precursor to a remote plasma unit;
  forming a plasma of the oxygen-containing precursor;
  delivering plasma effluents of the oxygen-containing precursor to a processing region of a semiconductor processing chamber, wherein the processing region is defined by one or more chamber components, wherein the one or more chamber components comprise a silicon oxide coating overlying the one or more chamber components and a carbon material on regions of the silicon oxide coating;
  removing the carbon material with the plasma effluents of the oxygen-containing precursor;
  halting delivery of the plasma effluents; and
  treating the silicon oxide coating with a hydrogen-containing material delivered to the processing region subsequent halting delivery of the plasma effluents, wherein the treating rehabilitates hydrogen depletion from delivery of plasma effluents of the oxygen-containing precursor.

19. The method of treating a chamber of claim 18, wherein treating the silicon oxide coating with a hydrogen-containing material comprises:
  flowing a hydrogen-containing gas into the processing region; and
  contacting the silicon oxide coating with the hydrogen-containing gas.

20. The method of treating a chamber of claim 18, wherein treating the silicon oxide coating with a hydrogen-containing material comprises:
  forming plasma effluents of a hydrogen-containing precursor;
  flowing the plasma effluents of the hydrogen-containing precursor into the processing region; and
  contacting the silicon oxide coating with the plasma effluents of the hydrogen-containing precursor.

* * * * *